United States Patent [19]

Min

[11] Patent Number: 5,430,767

[45] Date of Patent: Jul. 4, 1995

[54] METHOD AND APPARATUS FOR DEINTERLEAVING DIGITAL TRANSMISSION DATA

[75] Inventor: Byong-Min Min, Suwon, Rep. of Korea

[73] Assignee: Samsung Electronics Co., Ltd., Kyungki, Rep. of Korea

[21] Appl. No.: 120,764

[22] Filed: Sep. 15, 1993

[30] Foreign Application Priority Data

Sep. 15, 1992 [KR] Rep. of Korea ............... 1992-16759

[51] Int. Cl.$^6$ .................. H03D 1/00; H04L 27/06
[52] U.S. Cl. ...................... 375/340; 371/2.1; 371/39.1; 371/42
[58] Field of Search ............. 375/38, 39, 94; 371/2.1, 2.2, 37.4, 37.9, 38.1, 39.1, 40.1, 43, 44, 45, 46, 42

[56] References Cited

U.S. PATENT DOCUMENTS

| | | | |
|---|---|---|---|
| 3,652,998 | 3/1972 | Forney, Jr. | 371/2.1 |
| 4,641,327 | 2/1987 | Wei | 375/38 |
| 4,901,319 | 2/1990 | Ross | 371/2.1 |

Primary Examiner—Stephen Chin
Assistant Examiner—Don N. Vo
Attorney, Agent, or Firm—Sughrue, Mion, Zinn, Macpeak & Seas

[57] ABSTRACT

Disclosed is a deinterleaving system for receiving digital transmission data which is interleaved in units of a block and deinterleaving the received data. A sync signal is detected from the interleaved sync data which is included in the data of the received data block, and the deinterleaving is performed according to the detected sync data. In such a deinterleaving system, the transmission apparatus does not need to add a predetermined sync data to the interleaved source data when the data is transmitted, and the received data can be restored into the original data which was maintained prior to being interleaved.

12 Claims, 3 Drawing Sheets

METHOD AND APPARATUS FOR DEINTERLEAVING DIGITAL TRANSMISSION DATA

The present invention relates to a system for receiving interleaved and transmitted digital data in a receiver and deinterleaving the received digital data, and more particularly to a deinterleaving method and apparatus for detecting a sync pattern automatically in a receiver and restoring interleaved data into a state of the data which was maintained prior to being interleaved, without adding the interleaved data to interleaving information such as sync data.

Generally, digital signal processing and transmission technology is used in a high definition television signal transmission field as well as a data communication and transmission field such as a digital modem or a satellite communication. Such a digital communication and transmission method has an advantage that transmission power is small in comparison with an analog transmission method. On the other hand, the digital communication and transmission method has a defect that data transmission system is severely influenced by errors which are generated in transmission data by noise during transmission. To solve the above defect, a channel coding method for correcting data errors generated during transmission is used in the conventional data transmission system. There are a variety of channel coding methods, one of which is a concatenated coding method which greatly enhances error correction capability by performing error correction coding doubly.

FIGS. 1A and 1B are block diagrams of apparatus showing the conventional encoding and decoding methods, respectively. FIG. 1A shows a transmission apparatus which performs error correction coding doubly, and FIG. 1B shows a reception apparatus which performs error correction decoding doubly.

In FIG. 1A, a first encoder 11 adds input information data $D_{TI}$ to predetermined redundancy data, in order to recover the information data in an excellent state in a receiver, even though errors are generated in the information data by noise during transmission. Transmission efficiency of the data which is encoded by adding the input information data to the redundancy data is slightly lowered, but the data error correction capability is enhanced. The error correction coded data in first encoder 11 is supplied to first interleaver 12. Generally, an interleaver is an apparatus for improving error correction capability by dispersing a burst error which can be generated when transmitting data. First, interleaver 12 rearranges the data supplied from first encoder 11 into a predetermined different arrangement. Such data, which is error-correction-coded and interleaved in first encoder 11 and first interleaver 12, is again error-correction-coded and interleaved in a second encoder 13 and a second interleaver 14 into a different format, thereby enhancing the error correction capability of the transmission data. The above doubly coded and interleaved data is frequency-modulated in a modulator 15 so as to match the characteristics of the transmission channel. Here, modulator 15 loads sync data and interleaving-relating information on transmission data $D_{T0}$ to output the loaded data.

FIG. 1B shows a receiver for receiving transmission data which is coded in the channel coding apparatus such as that shown in FIG. 1A. The reception data $D_{RI}$, which is doubly error-correction-coded and interleaved, is demodulated in a demodulator 16. The output data of demodulator 16 is applied to a second deinterleaver 17. Second deinterleaver 17 restores the input data to a state which was maintained prior to being interleaved in second interleaver 14 of FIG. 1A. The output data of second deinterleaver 17 is supplied to a second decoder 18, which restores the input data to a state which was maintained prior to being error-correction-coded in second encoder 13 of FIG. 1A. The primarily deinterleaved and decoded data as described above is secondarily deinterleaved and decoded in a first deinterleaver 19 and a first decoder 20, respectively. That is, with respect to the data which is doubly coded and interleaved in the transmission apparatus, the reception apparatus also performs a double decoding and deinterleaving to restore the data into an original information data.

As described above, in the conventional transmission and reception method, the transmission apparatus transmits the coded and interleaved data together with the interleaving-related information to enhance error correction of the transmission data, and the reception apparatus restores the transmission data in response to the data synchronization therein according to the interleaving-related information. Thus, the transmission apparatus should insert additionally the frame sync signal and/or the vertical sync signal into the interleaved data for the sync establishment in the reception apparatus. Accordingly, this is an obstacle to enhancement of the data transmission efficiency due to the complicated hardware required.

SUMMARY OF THE INVENTION

Therefore, to solve the above problems, it is an object of the present invention to provide a deinterleaving method capable of restoring interleaved transmission data to a state which existed prior to being interleaved, by detecting in a reception apparatus sync data, wherein additional sync data is not inserted into interleaved transmission data, but instead the sync data is inserted into the error-correction-encoded information data to be interleaved in a transmission apparatus.

It is another object of the present invention to provide an apparatus for embodying a deinterleaving method of the above-described digital transmission data.

To accomplish the first object of the present invention, there is provided a method for deinterleaving digital transmission data into which sync data is inserted and which is interleaved in units of a data block having a predetermined size, the deinterleaving method comprising the steps of: latching unit data included in the interleaved data block; adding a value of preset unit data to the latched unit data; comparing the added value of the preset unit data with a predetermined reference value; and when the comparison result represents that the added value equals a desired value, sequentially recording the latched unit data on or reading the recorded data from storage means so as to be deinterleaved.

There is also provided an apparatus for deinterleaving digital transmission data into which sync data is inserted and which is interleaved in units of a data block having a predetermined size, the deinterleaving apparatus comprising: latch means for latching unit data in the interleaved data block; means for adding a value of preset unit data to the latched unit data in the latch means; a comparator for comparing the added value of the adder means with a predetermined reference value and producing an operation start signal when the comparison result represents that the added value equals a desired value; an address generator for generating a write address signal and a read address signal capable of deinterleaving the unit data in the data block when the operation start signal is applied herein from the comparator; and storage means for storing the unit data supplied from the latch means according to the write address signal supplied from the address generator or reading the stored unit data according to the read address signal.

DETAILED DESCRIPTION OF THE PREFERRED EMBODIMENT

A preferred embodiment of the present invention will be described below in more detail with reference to the accompanying drawings.

Figure 2:
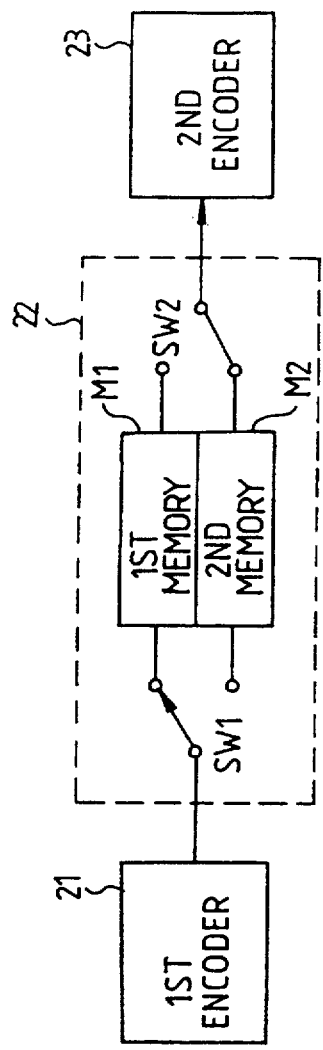
FIG. 2 is a detailed block diagram of an interleaver according to one embodiment of the present invention.

FIG. 2 is a block diagram of an interleaver for performing block interleaving according to the present invention. The interleaver of FIG. 2 may be used in both a double interleaving method and a single interleaving method.

A first encoder 21 of FIG. 2 inserts sync data into encoded information and supplies the inserted data to a first switch SW1. The format which inserts the sync data into the encoded data will be described hereafter in connection with a deinterleaving description. An interleaver 22 includes two memories M1 and M2 having a size of M×N, respectively. Also, interleaver 22 has two switches SW1 and SW2, each of which performs a switch operation so as to alternately access the two memories. That is, during a period when the data supplied from first encoder 21 is being recorded in first memory M1 via first switch SW1, second switch SW2 is connected to an output terminal of second memory M2, enabling the data read from second memory M2 to be transmitted to second encoder 23. When first switch SW1 is connected to second memory M2, second switch SW2 is connected to first memory M1. Here, assuming that first and second switches SW1 and SW2 are connected to first and second memories M1 and M2, the data output from first encoder 21 is recorded in first memory M1 of interleaver 22 via first switch SW1.

Figure 3:
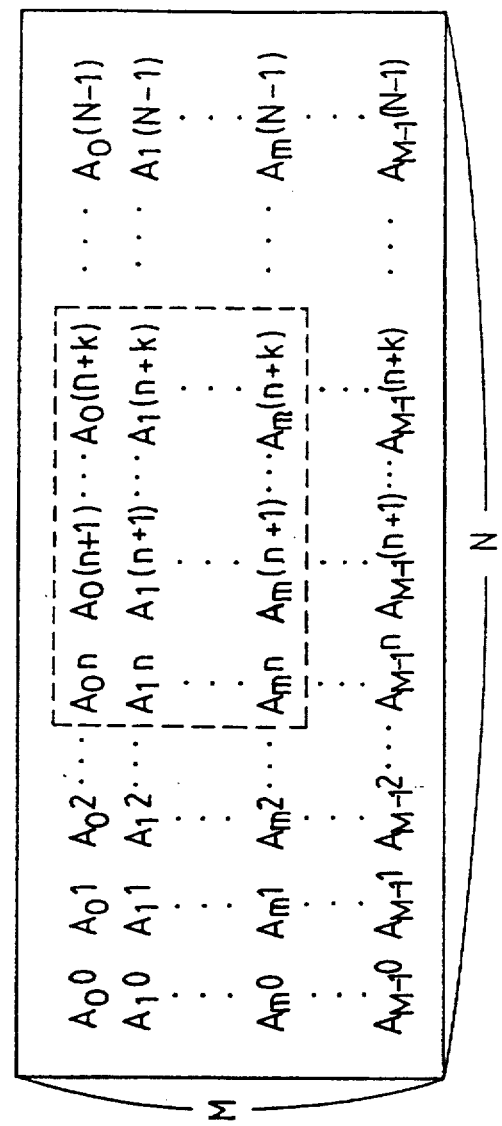
FIG. 3 is a schematic diagram representing a state of the data which is applied to the interleaver of FIG. 2.

FIG. 3 represents a format or data arrangement of a data block which is input to interleaver 22 and stored in first memory M1. The data array of the data block stored in first memory M1 is M×N data in sequence of $A_00, A_01, A_02, \ldots, A_0(N-1), \ldots, A_10, A_11, A_12, \ldots, A_1(N-1), \ldots, A_{m-1}0, A_{M-1}, A_{M-1}2, \ldots, A_{M-1}(N-1)$. In the data block of FIG. 3, the data of $A_0n, A_0(n+1), \ldots, A_0(n+k), \ldots, A_mn, A_m(n+1), \ldots, A_m(n+k)$ in the dotted box represents the unit sync data. Hereinafter, the entire dotted box is determined as sync data so as to be discriminated from the above unit sync data. When the data of a predetermined block is stored completely in first memory M1, and then the data of the next block is supplied from first encoder 21, first switch SW1 is connected to second memory M2 to supply the block data to second memory M2. In the above process, when first switch SW1 is connected to second memory M2, second switch SW2 is connected to first memory M1. Then, the data stored in first memory M1 in a format of FIG. 3 is read in a different sequence from that in the recording to transmit the read data to second encoder 23. Here, the switching operation is controlled by a memory controller (not shown) for controlling read and write operations in the memory.

Figure 4:
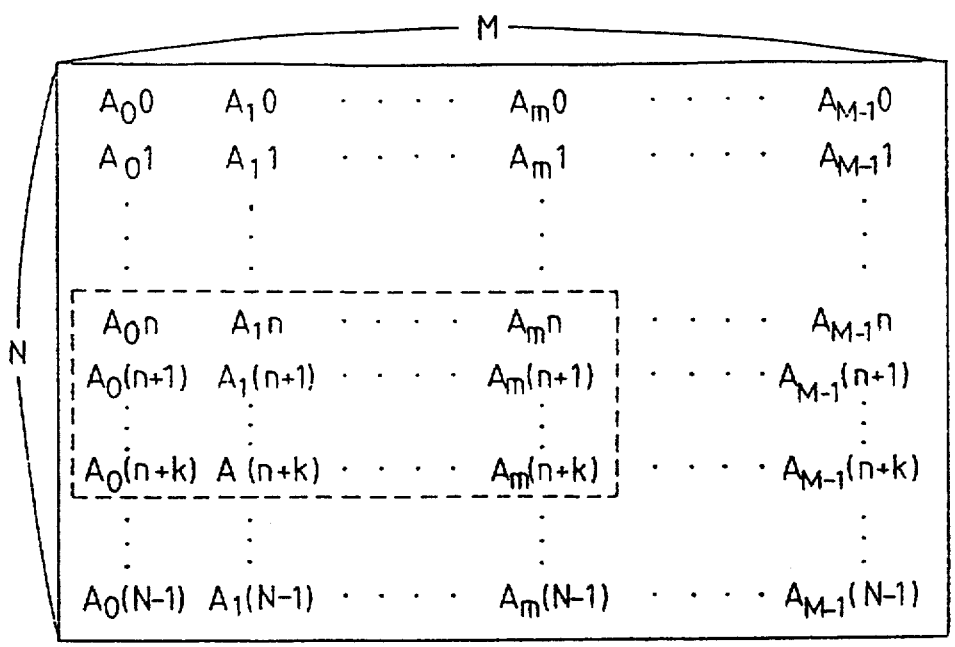
FIG. 4 is a schematic diagram representing a state of the data which appears at an output of the interleaver of FIG. 2.

FIG. 4 represents a format of data arrangement of the data which is read from first memory M1 and transmitted to second encoder 23 via second switch SW2 with respect to a data block. The data array read from first memory M1 is formed by being read in a column direction with respect to the stored data, that is in sequence of $A_00, A_10, \ldots, A_{M-1}0, A_01, A_11, \ldots, A_{M-1}1, \ldots, A_0(N-1), A_1(N-1), \ldots, A_{M-1}(N-1)$. Therefore, the interleaved data loses the original data array and has the data array of the mixed format shown in FIG. 4. According to the above method, first and second memories M1 and M2 alternately perform the write and read operations with respect to the respective blocks, to accordingly enable interleaver 22 to interleave the input data in a format shown in FIG. 4. The interleaved data in interleaver 22 as described above has added thereto a predetermined error correction code in second encoder 23, and the added data is interleaved in a different interleaving method by another interleaver, to then be supplied via a next modulator. Such a transmission signal is demodulated by a demodulator in a reception apparatus, and is restored into an original data array by a decoder and a deinterleaver corresponding to the encoder and the interleaver in the transmission apparatus.

Figure 5:
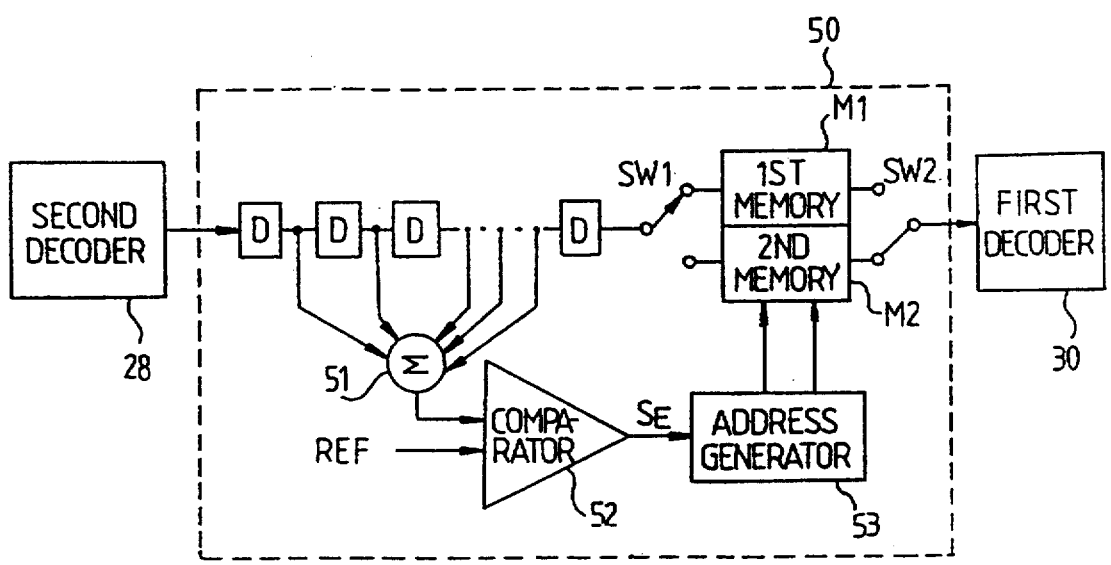
FIG. 5 is a detailed block diagram of a deinterleaver according to one embodiment of the present invention.

FIG. 5 shows a deinterleaving apparatus according to one embodiment of the present invention. The deinterleaving apparatus according to the present invention comprises a plurality of flip-flops D for latching a part of data among the data blocks including the unit sync data from the input respective block data. An adder 51 is connected to the output terminals of a predetermined number of the flip-flops for adding the output values of the predetermined number of the flip-flops among the plurality of the flip-flops. Also, the deinterleaving apparatus according to the present invention comprises a comparator 52 for comparing the output value of adder 51 with a preset reference value REF and outputting the comparison result, and an address generator 53 for generating a predetermined address signal according to the output value of comparator 52. In addition, the deinterleaving apparatus comprises a first memory M1 and a second memory M2 for storing or reading the data supplied via the plurality of the flip-flops according to the address signals transmitted from address generator 53. Between the output of the final flip-flop and the inputs of the memories is located a first switch SW1, which switches the data applied from the final flip-flop to first memory M1 and second memory M2, alternately. Further, between the outputs of the memories and a first decoder 30 is located a second switch SW2, which supplies the data recorded in the memories to first decoder 30, alternately. Here, first and second switches SW1 and SW2 always switch the plurality of memories M1 and M2.

Figure 1A:
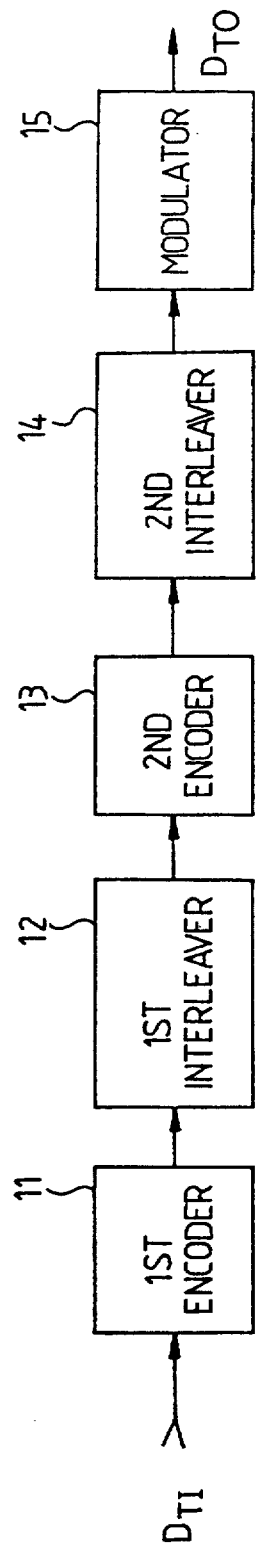
FIG. 1A is a block diagram of a part of a conventional data transmitter.
Figure 1B:
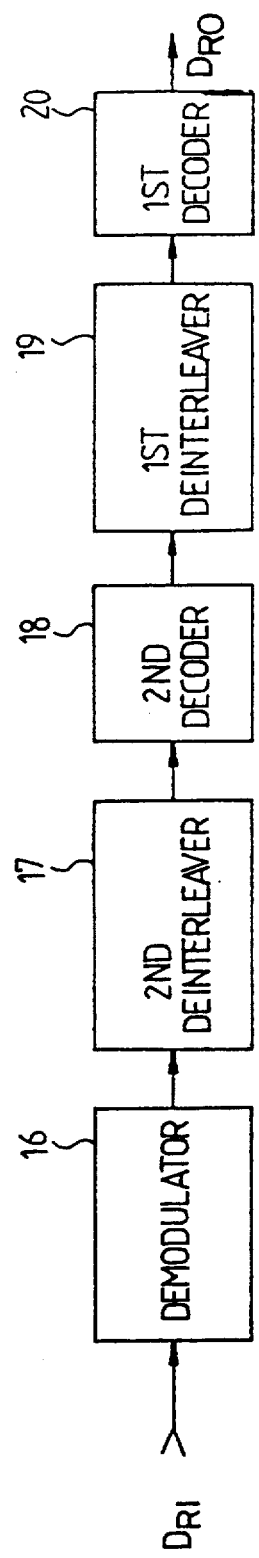
FIG. 1B is a block diagram of a part of a conventional data receiver.

It will be appreciated that second decoder 28, deinterleaver 50 and first decoder 30 can replace elements 18, 19 and 20, respectively, in FIG. 1B.

When the data shown in FIG. 4 is supplied to deinterleaver 50 from second decoder 28, and values of data $A_0n, A_1n, \ldots, A_mn, A_0(n+1), A_1(n+1), \ldots, A_m(n+1), \ldots, A_0(n+k), A_1(n+k), \ldots, A_m(n+k)$ corresponding to the unit sync data from the block data are all zero (that is, when the unit sync data is input to the reception apparatus as zero from the transmission apparatus), values of zero corresponding to the sync data among the data array supplied to flip-flop D of deinterleaver 50 are dispersed and input thereto. That is, since the data array of the data block shown in FIG. 4 is sequentially input to the flip-flop of deinterleaver 50, the unit sync data of $A_0n, A_1n, \ldots, A_mn, A_0(n+1), A_1(n+1), \ldots, A_m(n+1), \ldots, A_0(n+k), A_1(n+k), A_m(n+k)$ is dispersed and located in the entire data array.

The number of data items within the dashed block of FIG. 4 is $(m+1)$ rows x $(k+1)$ columns. However, since the data from the entire M×N block is received at deinterleaver 50 of FIG. 5 in sequence by rows and then succeeding columns, more than $(m+1)\times(k+1)$ flip-flops D are needed. However, $(m+1)\times(k+1)$ of these flip-flops D are connected to summation circuit 51 to detect the presence of the unit sync data.

The number of the D flip-flops in deinterleaver 50 corresponds to the number of the unit data from a first unit data $A_00$ of the data block to a final unit sync data $A_m(n+k)$ of the sync data. That is, when the unit data having the data array shown in FIG. 4 is input, the number of the flip-flops in deinterleaver 50 corresponds to $M\times(n+k)+(m+1)$. The $(m+1)\times(k+1)$ flip-flops among these flip-flops D latch unit sync data $A_0n$ through $A_m(n+k)$ included in the data block. Adder 51 adds the output values of $(m+1)\times(k+1)$ flip-flops D for detecting the unit sync data from the data which is sequentially supplied from second decoder 28, and supplies the added result to comparator 52. Then, comparator 52 compares the output value of adder 51 with a predetermined reference value REF. Accordingly, when the output value of adder 51 is smaller than reference value REF, it is judged that the sync is detected, to supply a predetermined operation start signal $S_E$ for starting to generate an address-to-address generator 53. In the above sync detection process, the $(m+1)\times(k+1)$ unit sync data, each of which has a value of zero, is latched in $(m+1)\times(k+1)$ sync detection flip-flops D. Here, the output values of the respective flip-flops D are added in adder 51, a value nearly close to zero is obtained. Then, address generator 53 generates a predetermined write address signal for first memory M1 or second memory M2 having a size of M×N, to thereby store the data array supplied via a plurality of the flip-flops D and first switch SW1 in the corresponding memory. That is, the block data having the data array shown in FIG. 4 is stored in first memory M1 or second memory M2. On the other hand, address generator 53 transmits a read address signal for deinterleaving according to the read control signal supplied from a memory controller (not shown), to first memory M1 or second memory M2 in which one data block is stored. Here, second switch SW2 is connected to the other memory to which first switch SW1 is not connected. The read address signal output from address generator 53 enables the data stored in the memory in a format of the data array shown in FIG. 4, to be read in sequence of $A_00, A_01, A_02, \ldots, A_0(N-1), \ldots, A_10, A_11, A_12, \ldots A_1(N-1), \ldots, A_{M-1}0, A_{M-1}2, \ldots, A_{M-1}(N-1)$. Then, the data array, which is read from the memory and transmitted to first decoder 30 via second switch SW2, is restored to a state of the data array which was maintained prior to being interleaved as shown in FIG. 3. In the above embodiment, even though the present invention is described in connection with a single deinterleaving, it is apparent to a person skilled in the art that subsequent deinterleaving operations can be performed by using the above sync data.

As described above, the deinterleaving system for digital transmission data according to the present invention inserts sync data into encoded image information or encoded audio information and then performs a block interleaving operation. Accordingly, even if separate sync data is added to the interleaved data in a transmission apparatus for transmitting the data, the sync data of the received data is automatically detected in a reception apparatus, to thereby restore the received data into a state of the data which was maintained prior to being interleaved.

What is claimed is:

1. An apparatus for deinterleaving digital transmission data into which sync data has been inserted and which is interleaved in units of a data block having a predetermined size, thereby forming interleaved block data, said deinterleaving apparatus comprising:

latch means for latching a plurality of unit data in the interleaved data block;

means for summing respective values of preset ones of said unit data latched in said latch means, said preset ones of said unit data corresponding in arrangement to the arrangement of said sync data in said data block to thereby produce a summed value;

a comparator for comparing said summed value with a predetermined reference value and producing an operation start signal when a comparison result indicates that the sync data is detected;

an address generator for generating a write address signal and a read address signal so as to permit deinterleaving of said unit data in said data block when the operation start signal is applied thereto from said comparator; and storage means for selectively storing said unit data supplied from said latch means according to the write address signal supplied from the address generator and reading the stored unit data according to the read address signal.

2. The deinterleaving apparatus for digital transmission data according to claim 1, wherein said latch means comprises a plurality of flip-flops for latching selected said unit data from an initial unit data of a sequentially input said data block to a last unit data comprising said sync data included in said data block.

3. The deinterleaving apparatus for digital transmission data according to claim 2, wherein data input terminals of said summing means are connected to respective ones of said flip-flops of said latch means, so that said sync data is added when the initial unit data of said data block is latched in one of said flip-flop which is closest to said storage means.

4. The deinterleaving apparatus for digital transmission data according to claim 3, wherein at least one of said values of said unit data constituting said sync data is set as zero.

5. The deinterleaving apparatus for digital transmission data according to claim 4, wherein said reference value falls within a range in which said operation start signal is not mistakenly detected, when the other of said unit data constituting said sync data is summed.

6. The deinterleaving apparatus for digital transmission data according to claim 5, wherein said comparator generates said operation start signal when said summed value of said unit data is smaller than said reference value.

7. The deinterleaving apparatus for digital transmission data according to claim 3, wherein said address generator generates said write address signal so that said unit data supplied from said latch means is recorded in said storage means in sequence of being input to said storage means, and generates a read address signal so that said unit data stored in said storage means is read so as to be deinterleaved.

8. The deinterleaving apparatus for digital transmission data according to claim 7, wherein said storage means comprises at least two memories having a storage capacity corresponding in size to said data block.

9. The deinterleaving apparatus for digital transmission data according to claim 8, wherein said address generator applies said write address signal and said read address signal to said memories alternately.

10. A method for deinterleaving digital transmission data into which sync data is inserted and which is interleaved in units of a data block having a predetermined size, said deinterleaving method comprising the steps of:
   latching a plurality of unit data included in an interleaved data block;
   summing respective values of preset ones of the unit data which have been latched, to thereby provide a summed value, wherein said preset ones of said unit data correspond to the arrangement of said sync data in said data block;
   comparing said summed value of said preset ones of said unit data with a predetermined reference value; and
   when the comparison result indicates that the summed value equals a desired value, sequentially recording the latched said unit data on or reading the recorded data from storage means so as to be deinterleaved.

11. The deinterleaving method of digital transmission data according to claim 10, wherein said latching step comprises a step of sequentially latching the unit data from an initial unit data of a sequentially input said data block to a last unit data comprising said sync data included in the interleaved data block.

12. The deinterleaving method of digital transmission data according to claim 11, wherein said preset unit data is the unit data constituting a sync signal.

* * * * *